(12) United States Patent
Jiang et al.

(10) Patent No.: US 10,473,992 B2
(45) Date of Patent: Nov. 12, 2019

(54) DISPLAY PANEL, METHODS OF FABRICATING AND REPAIRING THE SAME

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Xuebing Jiang, Beijing (CN); Jilei Gao, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 141 days.

(21) Appl. No.: 15/541,566

(22) PCT Filed: Aug. 9, 2016

(86) PCT No.: PCT/CN2016/094093
§ 371 (c)(1),
(2) Date: Jul. 5, 2017

(87) PCT Pub. No.: WO2018/027523
PCT Pub. Date: Feb. 15, 2018

(65) Prior Publication Data
US 2018/0267375 A1    Sep. 20, 2018

(51) Int. Cl.
*G02F 1/1362*    (2006.01)
*H01L 27/12*    (2006.01)
(Continued)

(52) U.S. Cl.
CPC ...... *G02F 1/136259* (2013.01); *G02F 1/1339* (2013.01); *G02F 1/13392* (2013.01);
(Continued)

(58) Field of Classification Search
None
See application file for complete search history.

(56) References Cited

U.S. PATENT DOCUMENTS

2006/0170854 A1* 8/2006 Han ..................... G02F 1/1339
349/153
2007/0096633 A1* 5/2007 Lee ..................... H01L 27/3258
313/500
(Continued)

FOREIGN PATENT DOCUMENTS

CN    101359108 A    2/2009
CN    101435923 A    5/2009
(Continued)

OTHER PUBLICATIONS

Feng, Liquid crystal display panel and restoring method thereof, 2007, English language machine translation of CN101435923A, pp. 1-4. (Year: 2007).*
(Continued)

*Primary Examiner* — Angel Roman
(74) *Attorney, Agent, or Firm* — Intellectual Valley Law, P.C.

(57) ABSTRACT

The present application discloses a display panel including an array substrate and an opposing substrate facing the array substrate; a data line layer having a plurality of data lines on the array substrate; a passivation layer on a side of the data line layer proximal to the opposing substrate; a sealant layer on a side of the passivation layer distal to the data line layer, sealing the array substrate and the opposing substrate together; the display panel having a first area enclosed by the sealant layer and a second area outside of the first area and the sealant layer; the plurality of data lines extending from the first area into the second area; and a common electrode layer on a side of the sealant layer distal to the passivation layer. The common electrode layer includes a portion having
(Continued)

a plurality of connections, and a plurality of slits spaced apart from each other by the plurality of connections; the plurality of slits and the plurality of connections extending from the first area into the second area, each of the plurality of connections is between two adjacent slits; each of the plurality of connections has a first portion in the first area and a second portion in the second area.

18 Claims, 5 Drawing Sheets

(51) Int. Cl.
- *G02F 1/1343* (2006.01)
- *G02F 1/1333* (2006.01)
- *G02F 1/1339* (2006.01)
- *G02F 1/1345* (2006.01)
- *G02F 1/1335* (2006.01)

(52) U.S. Cl.
CPC .... *G02F 1/13452* (2013.01); *G02F 1/133345* (2013.01); *G02F 1/133514* (2013.01); *G02F 1/134309* (2013.01); *G02F 1/136204* (2013.01); *G02F 1/136286* (2013.01); *H01L 27/124* (2013.01); *H01L 27/1262* (2013.01); *G02F 2001/134318* (2013.01); *G02F 2001/136263* (2013.01); *G02F 2001/136295* (2013.01); *G02F 2202/16* (2013.01)

(56) References Cited

U.S. PATENT DOCUMENTS

| | | | |
|---|---|---|---|
| 2008/0158127 A1* | 7/2008 | Chang | G02F 1/136259 345/93 |
| 2009/0033843 A1* | 2/2009 | Gao | G02F 1/1345 349/106 |
| 2012/0212698 A1 | 8/2012 | Lee et al. | |
| 2013/0148061 A1 | 6/2013 | Wang et al. | |
| 2015/0294995 A1* | 10/2015 | Wang | G02F 1/1345 257/390 |
| 2017/0285430 A1 | 10/2017 | Hu et al. | |

FOREIGN PATENT DOCUMENTS

| | | |
|---|---|---|
| CN | 101592797 A | 12/2009 |
| CN | 201876644 U | 6/2011 |
| CN | 202149999 U | 2/2012 |
| CN | 102650776 A | 8/2012 |
| CN | 103116234 A | 5/2013 |
| CN | 105093759 A | 11/2015 |
| JP | H08201843 A | 8/1996 |

OTHER PUBLICATIONS

International Search Report & Written Opinion dated Apr. 26, 2017, regarding PCT/CN2016/094093.

First Office Action in the Chinese Patent Application No. 201680000669.8, dated Dec. 3, 2018; English translation attached.

* cited by examiner

DISPLAY PANEL, METHODS OF FABRICATING AND REPAIRING THE SAME

CROSS-REFERENCE TO RELATED APPLICATION

This application is a national stage application under 35 U.S.C. § 371 of International Application No. PCT/CN2016/094093 filed Aug. 9, 2016, the contents of which are incorporated by reference in the entirety.

TECHNICAL FIELD

The present invention relates to a display panel, and methods of fabricating and repairing the same.

BACKGROUND

Liquid crystal display devices have found a wide range of applications in display technology field. Typically, liquid crystal display devices include an array substrate and a opposing substrate (e.g., a color filter substrate) packaged together. The array substrate and the opposing substrate are fabricated separately, then assembled to produce a display panel.

SUMMARY

In one aspect, the present disclosure provides a display panel comprising an array substrate and an opposing substrate facing the array substrate; a data line layer comprising a plurality of data lines on the array substrate; a passivation layer on a side of the data line layer proximal to the opposing substrate; a sealant layer on a side of the passivation layer distal to the data line layer, sealing the array substrate and the opposing substrate together; the display panel comprising a first area enclosed, by the sealant layer and a second area outside of the first area and the sealant layer, the plurality of data lines extending from the first area into the second area; and a common electrode layer on a side of the sealant layer distal to the passivation layer.

Optionally, the common electrode layer comprises a portion having a plurality of connections, and a plurality of slits spaced apart from each other by the plurality of connections; the plurality of slits and the plurality of connections extending from the first area into the second area, each of the plurality of connections is between two adjacent slits; each of the plurality of connections has a first portion in the first area and a second portion in the second area.

Optionally, each of the plurality of connections is configured to be insulated from the common electrode layer when cut at both the first portion and the second portion.

Optionally, the display panel further comprises a common electrode signal line layer on the array substrate; the sealant layer comprises a plurality of conductive components; and the common electrode layer on the opposing substrate and the common electrode signal layer on the array substrate are electrically connected by the plurality of conductive components.

Optionally, the display panel further comprises an insulating layer on a side of the common electrode signal line layer proximal to the sealant layer; and a conductive layer on a side of the insulating layer distal to the common electrode signal line layer; the conductive layer being electrically connected to the common electrode signal line layer through a via extending through the insulating layer; the common electrode layer on the opposing substrate and the conductive layer on the array substrate are electrically connected by the plurality of conductive components.

Optionally, the plurality of conductive components are a plurality of gold balls.

Optionally, the plurality of data lines extending from the first area into the second area through an area substantially corresponding to the portion of the common electrode layer having the plurality of slits and the plurality of connections in plan view of the display panel.

Optionally, each of the plurality of connections corresponds to each of the plurality of data lines; a projection of each of the plurality of connections on the array substrate overlaps that of each of the plurality of data lines in plan view of the display panel.

Optionally, the common electrode layer further includes at least one insulated island in the portion having the plurality of connections and the plurality of slits; the plurality of slits being spaced apart from each other by the plurality of connections and the at least one insulated island, each of the at least one insulated island being between two slits adjacent thereto, extending from the first area into the second area; and each of the at least one insulated island is insulated from the rest of the common electrode layer by the two slits adjacent thereto, a first gap in the first area, and a second gap in the second area; the two slits adjacent thereto, the first gap and the second gap surrounding a complete periphery of each of the at least one insulated island.

Optionally, the opposing substrate is a color filter substrate.

In another aspect, the present invention provides a display apparatus comprising a display panel described herein.

In another aspect, the present invention provides a method of repairing an electrical short circuit between a data line and a common electrode layer in the display panel described herein, comprising identifying the data line involved in the electrical short circuit; identifying a connection in the display panel from an area corresponding to the data, line in plan view of the display panel; and insulating the connection from the common electrode layer by disconnecting the connection from the common electrode layer at both the first portion and the second portion.

Optionally, the step of insulating the connection from the common electrode layer is performed by laser cutting the connection at both the first portion and the second portion.

In another aspect, the present invention provides a method of fabricating a display panel, comprising forming an opposing substrate on a first base substrate; the step of forming the opposing substrate comprising forming a common electrode layer on the first base substrate; forming an array substrate on a second base substrate; the step of forming the array substrate comprises forming a data line layer comprising a plurality of data lines on the second base substrate; and forming a passivation layer on a side of the date line layer distal to the second base substrate; and sealing the opposing substrate and the array substrate by a sealant layer thereby forming the display panel comprising a first area enclosed by the sealant layer and a second area outside of the first area and the sealant layer.

Optionally, the step of forming the common electrode layer comprises forming plurality of connections, and a plurality of slits spaced apart by the plurality of connections in a portion of the common electrode layer; the plurality of slits and the plurality of connections extending from the first area into the second area, each of the plurality of connections is between two adjacent slits; and each of the plurality of connections is formed to have a first portion in the first area and a second portion in the second area.

Optionally, the step of forming the array substrate further comprises forming a common electrode signal line layer on the second base substrate; and the step of sealing the opposing substrate and the array substrate by die sealant layer comprises forming a sealant layer comprising a plurality of conductive components; and the method further comprising electrically connecting the common electrode layer and the common electrode signal line layer by the plurality of conductive components in the sealant layer.

Optionally, the step of forming the array substrate further comprises forming an insulating layer on a side of the common electrode signal line layer proximal to the sealant layer; forming a conductive layer on a side of the insulating layer distal to the common electrode signal line layer; forming a via extending through the insulating layer; electrically connecting the conductive layer and the common electrode signal line layer through the via; and electrically connecting the common electrode layer and the conductive layer by the plurality of conductive components.

Optionally, the plurality of conductive components are a plurality of gold balls.

Optionally, the data line layer is formed so that the plurality of data lines extending from the first area into the second area through an area substantially corresponding to the portion of the common electrode layer having the plurality of slits and the plurality of connections in plan view of the display panel.

Optionally, the data line layer and the common electrode layer are so formed that each of the plurality of connections corresponds to each of the plurality of data lines; a projection of each of the plurality of connections overlaps a projection of each of the plurality of data lines in plan view of the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In some conventional, display panels, the common electrode layer is disposed in the opposing, substrate and the common electrode signal line is disposed in the array substrate. Conventional display panels use a sealant layer made of a mixture of resin and gold balls for electrically connecting the common electrode layer in the opposing substrate and the common electrode signal line in the array substrate. In conventional display panels, the data line layer and the gold balls in the sealant layer are insulated merely by a thin passivation layer. Typically, the passivation layer has a thickness in the range of approximately 2000 Å to approximately 9000 Å, and thus is prone to physical damages and electrostatic breakdown, leading to an electrical short circuit between the common electrode layer and the data line (D-C short).

In one aspect, the present disclosure is directed to a novel display panel, methods of fabricating and repairing the same that substantially obviates one or more of the problems due to limitations and disadvantages of the related art. In some embodiments, the present display panel includes an array substrate and an opposing substrate facing the array substrate; a data line layer having a plurality of data lines on the array substrate; a passivation layer on a side of the data line layer proximal to the opposing, substrate; a sealant layer on a side of the passivation layer distal to the data line layer, sealing the array substrate and the opposing substrate together the display panel having: a first area enclosed by the sealant layer and a second area outside of the first area and the sealant layer; the plurality of data lines extending from the first area into the second area; and a common electrode layer on a side of the sealant layer distal to the passivation layer. The common electrode layer in the present display panel includes a portion having a plurality of connections, and a plurality of slits spaced apart from each other by the plurality of connections. Optionally, the plurality of slits and the plurality of connections extend from the first area into the second area. Each of the plurality of connections is between two adjacent slits. Each of the plurality of connections has a first portion in the first area and a second portion in the second area.

Figure 1:
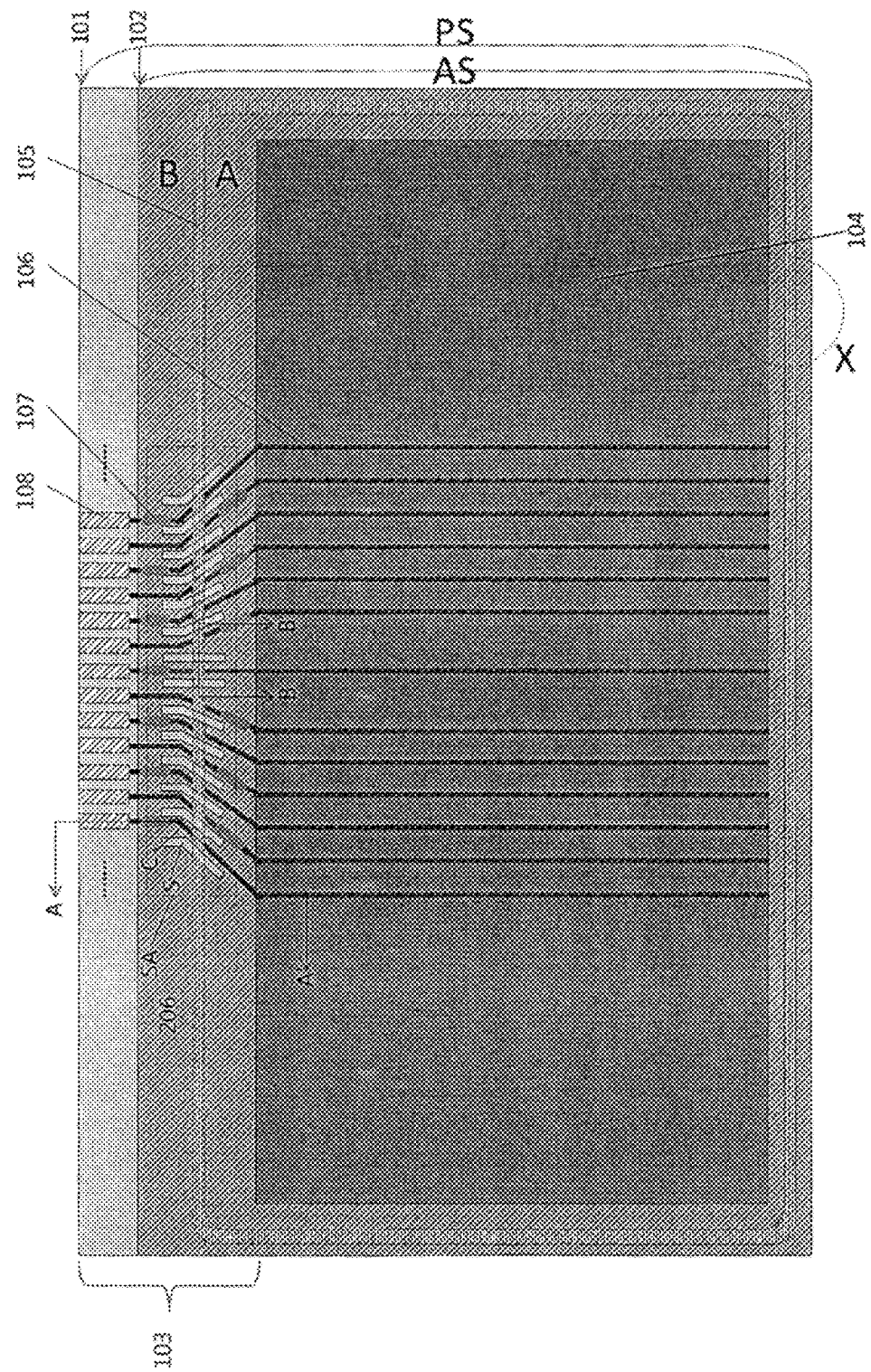
FIG. 1 is a diagram illustrating the structure of a display panel in some embodiments.

FIG. 1 is a diagram illustrating the structure of a display panel in some embodiments. Referring to FIG. 1, the display panel in the embodiment includes an array substrate AS and an opposing substrate PS facing the array substrate AS. The line 101 in FIG. 1 indicates an edge of the array substrate AS, and the line 102 indicates an edge of the opposing substrate PS. The display panel includes a display area 104 and a peripheral area outside of the display area. On one side of the display panel, various signal lines are connected to a printed circuit board (not shown in FIG. 1) in a fan-out area 103, which is a part of the peripheral area of the display panel.

The display panel further includes a sealant layer 105 for sealing the array substrate AS and the opposing substrate PS together to form a cell. The sealant layer 105 divides the display panel into two areas, i.e., a first area A enclosed by the sealant layer 105 and a second area B outside of the first area A and the sealant layer 105 (see, also, areas "A" and "B" in FIG. 1).

Referring to FIG. 1, the display panel further includes a data line layer having a plurality of data lines 106. The plurality of data lines 106 extend from the display area 104 of the display panel into the peripheral area of the display panel. After the plurality of data lines 106 exit the display area 104, they enter into the first area A enclosed by the sealant layer 105. The plurality of data lines 106 extend from the first area A into the second area B, crossing over an interface area (see area "I" in FIG. 4) corresponding to the sealant layer 105. In plan view of the display panel, the plurality of data lines 104 crosses over a projection of the sealant layer 105 on the array substrate.

In some embodiments, the common electrode signal for the common electrode layer in the opposing substrate is provided by the common electrode signal line layer disposed in the array substrate. For example, the display panel may include a common electrode layer in the opposing substrate electrically connected to a common electrode signal line layer in the array substrate. Various embodiments may be practiced to electrically connect the common electrode layer in the opposing substrate to the common electrode signal line layer in the array substrate. Optionally, the common electrode layer in the opposing substrate is electrically connected to the common electrode signal line layer in the array substrate through the sealant layer in the peripheral area. For example, they may be connected in an area X as shown in FIG. 1.

Figure 2:
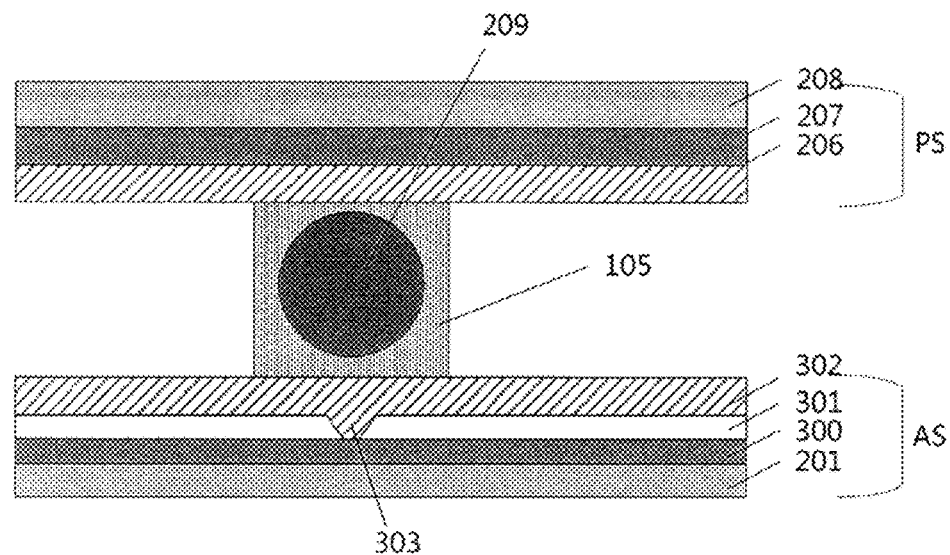
FIG. 2 is a diagram illustrating the structure of a display panel, in some embodiments.

FIG. 2 is a diagram illustrating the structure of a display panel in some embodiments. Referring to FIG. 2, the opposing substrate PS in the display panel includes a first base substrate 208, a black matrix layer 207 on the first base substrate 208, and a common electrode layer 206 on a side of the black matrix layer distal to the first base substrate 208. Me array substrate AS in the display panel includes a second base substrate 201, a common electrode signal line layer 300 on the second base substrate 201, an insulating layer 301 on a side of the common electrode signal line layer 300 distal to the second base substrate 201, and a conductive layer 302 on a side of the insulating layer 301 distal to the common electrode signal line layer 300. The insulating layer 301 includes a via 303, and the conductive layer 302 is electrically connected to the common electrode signal line layer 300 through the via 303 extending through the insulating layer 301.

Referring to FIG. 2, the display panel further includes a sealant layer 105 between the array substrate AS and the opposing substrate PS, sealing the array substrate AS and the opposing substrate PS together into a cell. The sealant layer 105 includes a plurality of conductive components 209. The common electrode layer 206 in the opposing substrate PS may be electrically connected to the common electrode signal line layer 300 in the array substrate AS through the conductive components 209 in the sealant layer 105. Optionally, the common electrode layer 296 is electrically connected to the common electrode signal line layer 300 through the conductive component 209 and the conductive layer 302 extending through the via 303 in the insulating layer 301. In some embodiments, the common electrode layer 206 is an integral layer extending throughout the opposing substrate PS.

Examples of conductive components 209 include, hut are not limited to, metal balls such as gold balls or nickel balls. Various embodiments may be practiced to make the conductive components 209. In some examples, the conductive components 209 are made of elastic resin particles coated with metals such as gold or nickel. Optionally, the conductive components 209 have a size in the range of approximately 1 μm to approximately 500 μm.

Referring to FIG. 1, the common electrode layer 206 in the embodiment includes a slit area SA having a plurality of connections C, and a plurality of slits S spaced apart from each, other by the plurality of connections C. Each of plurality of connections C is arranged between two adjacent slits S. As shown in FIG. 1, the plurality of slits S and the plurality of connections C extend from the first area A into the second area. B. i.e., the plurality of slits S and the plurality of connections C in plan view of the display panel cross over a projection of the sealant layer 105 on the array substrate. A projection of the sealant layer 105 on the slit S divides the slit S into a first portion in the first area A and a second portion in the second area B. A projection of the sealant layer 105 on the connection C divides the connection C into a first portion in the first area A and a second portion in the second area B. Thus, each of the plurality of connections C has a first side in the first area A and a second side in the second area B.

Figure 3A:
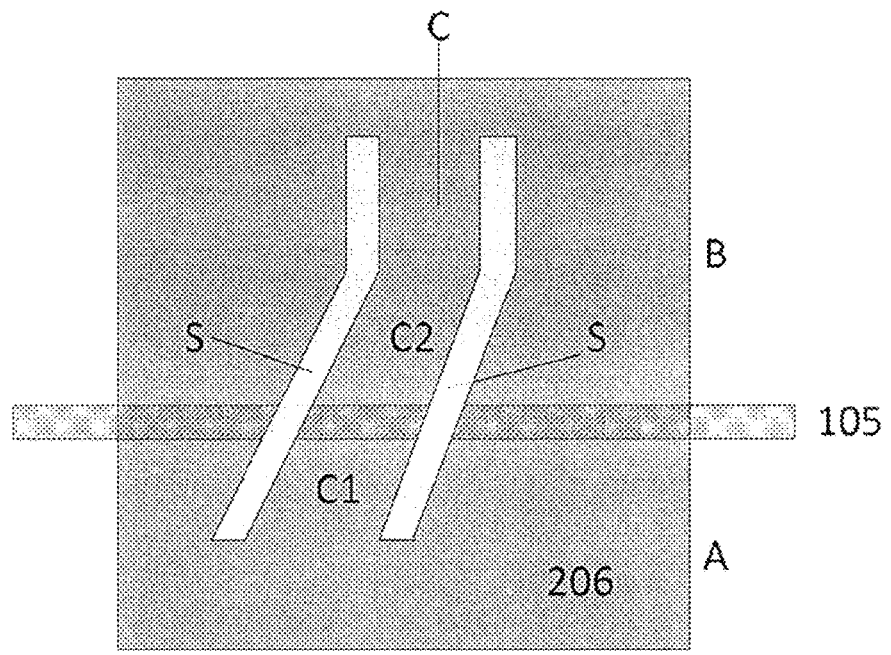
FIGS. 3A-3B are diagrams illustrating the structure of a connection and two adjacent slits in some embodiments.
Figure 3B:
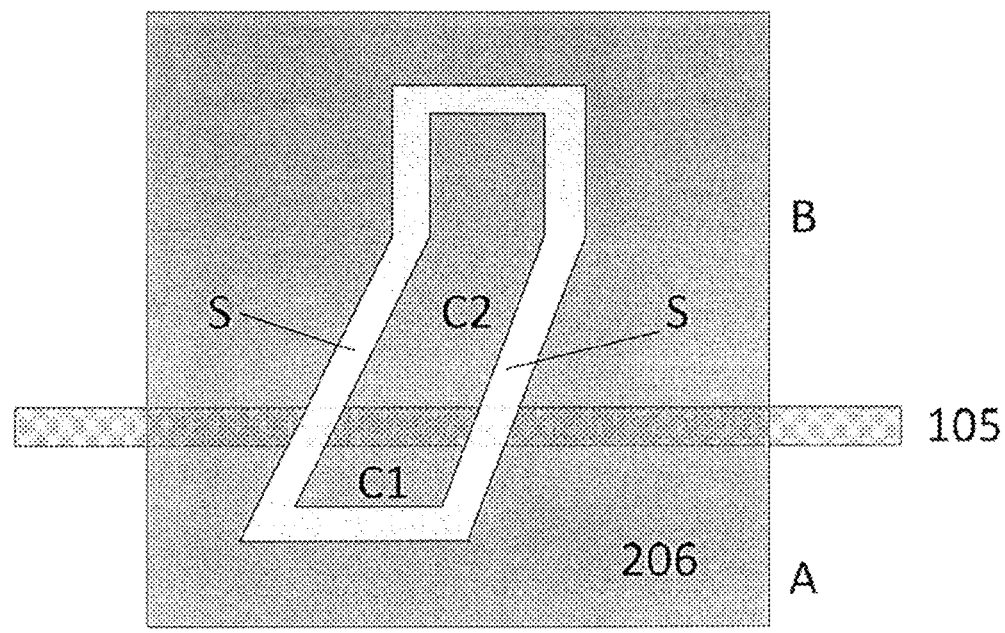

FIGS. 3A-3B are diagrams illustrating the structure of a connection and two adjacent slits in some embodiments. FIG. 3A shows a connection C sandwiched by two adjacent slits S in a common electrode layer 206. As shown in FIG. 3A, a projection of the sealant layer 105 on the connection C divides the connection C into a fast portion C1 in the first area A and a second portion C2 in the second area B. The connection C may be cut from both sides to be insulated from the rest of the common electrode layer 206. FIG. 3B shows an insulated island after the connection C being cut at both the first portion C1 in the first area A and the second portion C2 in the second area B.

Referring to FIG. 1, the display panel in the embodiment includes a plurality of connections C and a plurality of slits S in the slit area SA. The slit area SA corresponds to an area where the plurality of data line 106 extending from the first area A into the second area B. In some embodiments, each connection C corresponds to one or more data line 106, e.g., a projection of each connection C on the array substrate AS overlaps with that of one or more data line 106 in plan view of the display panel. Optionally, each connection C corresponds to a single data line 106, e.g., a projection of each connection C on the array substrate AS overlaps with that of a single data line 106 in plan view of the display panel. Optionally, the plurality of data lines 106 are arranged so that a projection of substantially all data lines 106 on the array substrate AS overlaps with that of substantially all connection C in plan view of the display panel.

Referring to FIG. 1, the plurality of data lines 106 exiting from the slit area SA are connected to a plurality of gate line-data line bridges 107 (G-D bridges) in the fan-out area 103, and in turn connected to a plurality of bonding pads 108 for bonding with a printed circuit board.

Figure 4:
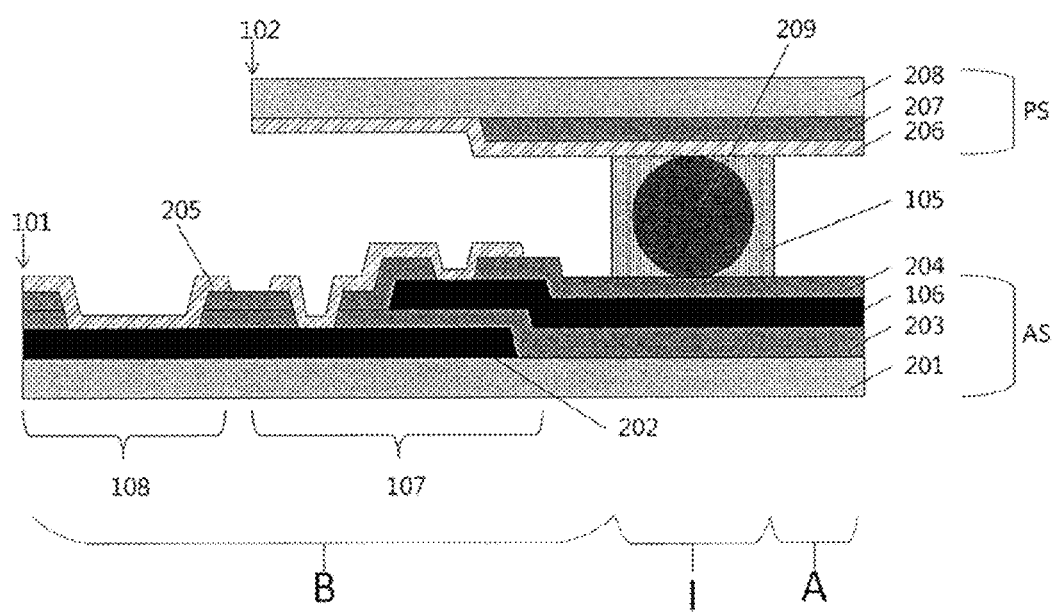
FIG. 4 shows a cross-sectional view along the A-A' direction of the display panel of FIG. 1.

FIG. 4 shows a cross-sectional view along the A-A' direction of the display and of FIG. 1. Referring to FIG. 4, the display panel in the embodiment includes an array substrate AS, an opposing substrate PS facing the array substrate AS, and a sealant layer 105 sealing the array substrate AS and the opposing substrate PS together in a cell. The opposing substrate PS in FIG. 4 includes a first base substrate 208, a black matrix layer 207 on the first base substrate 208, and a common electrode layer 206 on a side of the black matrix layer 207 distal to the first base substrate 208. In the first area A, the array substrate AS includes a second base substrate 201, a gate insulating layer 203 on the second base substrate 201, a data line layer 106 on a side of the gate insulating layer 203 distal to the second base substrate 201, and a passivation layer 204 on a side of the data line layer 106 distal to the gate insulating layer 203. The sealant layer 105 is on a side of the passivation layer 204 distal to the data line layer 106, and on a side of the common electrode layer 206 distal to the black matrix layer 207, the sealant layer 105 is sandwiched between the common electrode layer 206 and the passivation layer 204 in the interface area I.

Various appropriate materials may be used to make the passivation layer 204. Examples of appropriate materials include, but are not limited to, silicon nitride ($SiN_x$), silicon oxide ($SiO_x$), and silicon oxide nitride ($SiO_xN_y$). Optionally the passivation layer 204 has a thickness in the range of approximately 2000 Å to approximately 9000 Å.

Referring to FIG. 4, the data line 106 extends from the first area A and the interface area I into the second area B. In the second area B, the array substrate AS includes a G-D bridge 107 and a bonding pad 108. The G-D bridge 107 includes a gate line layer 202 on the second base substrate 201, a gate insulating layer 203 on a side of the gate line layer 202 distal to the second base substrate 201, a data line layer 106 on a side of the gate insulating layer 106 distal to the gate line layer 202, a passivation layer 204 on a side of the data line layer 106 distal to the gate insulating layer 203, and a conductive layer 205 on a side of the passivation layer 204 distal to the data line layer 106. The conductive layer 205 is electrically connected to the data line layer 106 through a via extending through the passivation layer 204.

The bonding pad 108 in FIG. 4 includes a gate line layer 202 on the second base substrate 201, a gate insulating layer 203 on a side of the gate line layer 202 distal to the second base substrate 201, a passivation layer 204 on a side of the gate insulating layer 203 distal to the gate line layer 202, and a conductive layer 205 on a side of the passivation layer 204 distal to the gate insulating layer 203. The conductive layer 205 is electrically connected to the gate line layer 202 through a via extending through the passivation layer 204 and the gate insulating layer 203.

Figure 5:
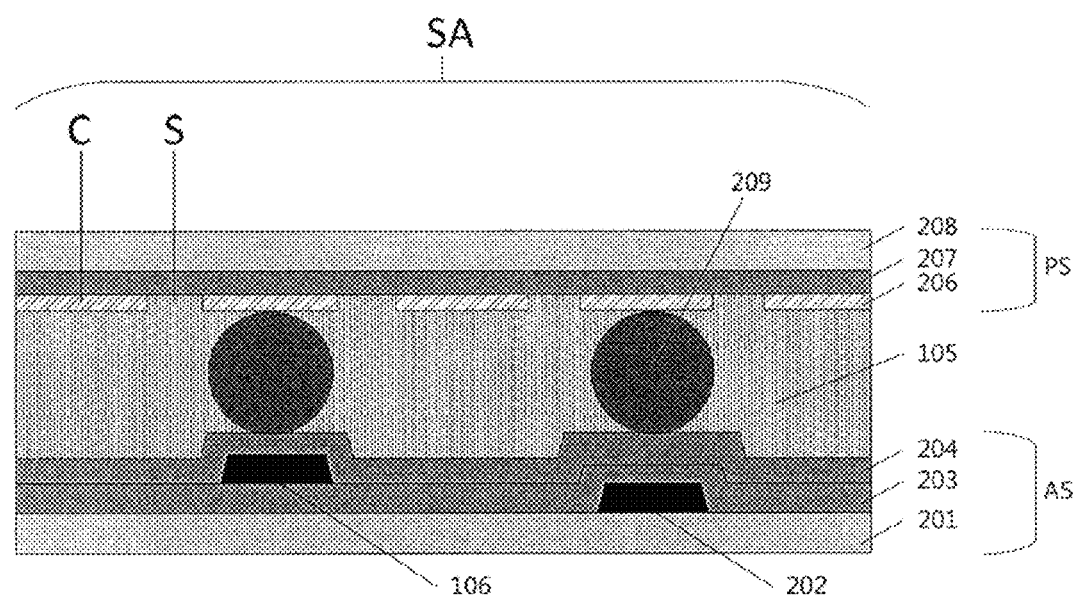
FIG. 5 shows a cross-sectional view along the B-B' direction of the display panel of FIG. 1.

FIG. 5 shows a cross-sectional view along the B-B' direction of the display panel of FIG. 1. Referring to FIG. 5, the display panel in the embodiment includes an array substrate AS, an opposing substrate PS facing the array substrate AS, and a sealant layer 105 sealing the array substrate AS and the opposing substrate PS together in a cell. The opposing substrate PS in FIG. 5 includes a first base substrate 208, a black matrix layer 207 on the first base substrate 208, and a common electrode layer 206 on aside of the black matrix layer 207 distal to the first base substrate 208. The common electrode layer 206 includes a plurality of connections C, and a plurality of slits S spaced apart from each other by the plurality of connections C. Each of plurality of connections C is arranged between two adjacent slits S.

The array substrate AS in FIG. 5 includes a second base substrate 201, a gate line layer 202 on the second base substrate 201, a gate insulating layer 203 on a side of the gate line layer 202 distal to the second base substrate 201, a data line layer 106 on a side of the gate insulating layer 203 distal to the second base substrate 201, and a passivation layer 204 on a side of the data line layer 106 distal to the gate insulating layer 203.

The sealant layer 105 in FIG. 5 is on a side of the passivation layer 204 distal to the data line layer 106, and on a side of the common electrode layer 206 distal to the black matrix layer 207, i.e., the sealant layer 105 is sandwiched between the common electrode layer 206 and the passivation layer 204. The sealant layer 105 includes a plurality of conductive components 209.

As shown in FIGS. 4 and 5, the data line layer 106 and the conductive component 209 are insulated by the passivation layer 204. Typically, the passivation layer 204 has a thickness in the range of approximately 2000 Å to approximately 9000 Å. The passivation layer 204 is prone to physical damages, e.g., those resulting from the conductive component 209 being pressed against the passivation layer 204. Moreover, the passivation layer 204 is also prone to electrostatic breakdown. For example, the electrostatic breakdown voltage for a passivation layer 204 having a thickness in the range of approximately 2000 Å to approximately 9000 Å is typically in the range of 100 V to 300 V, whereas electrostatic voltage in a display panel may be as high as 2000 Å. Therefore, one issue associated with the conventional display panel is the electrical short circuit occurred between a data line 106 and a common electrode layer 206.

Figure 6A:
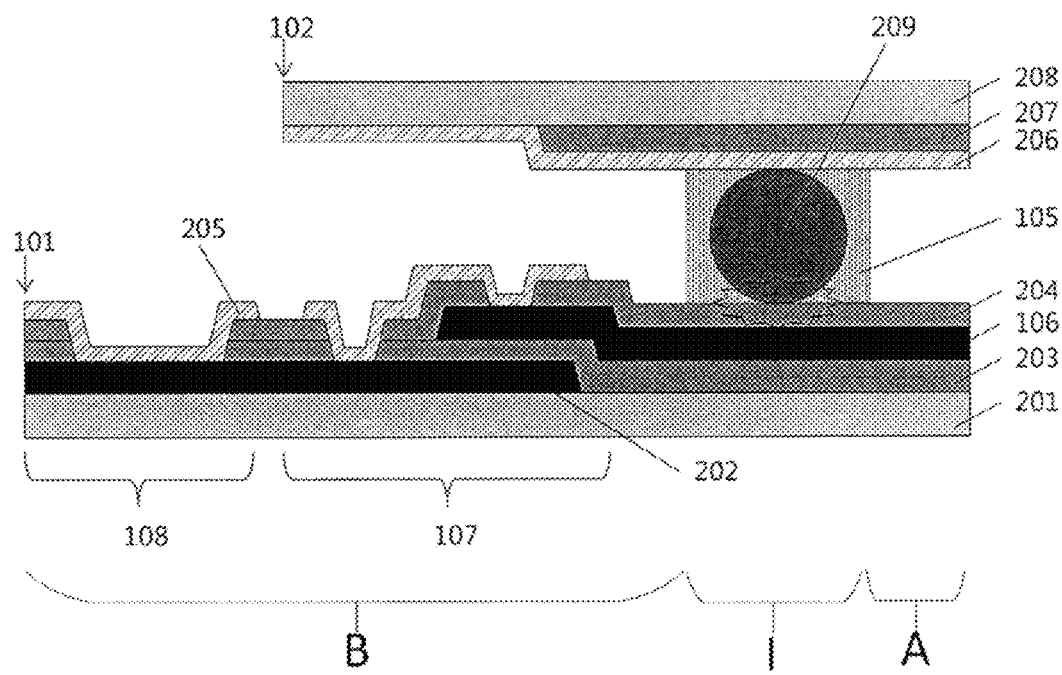
FIGS. 6A-6B illustrate a process of repairing, an electrical short circuit between a data line and a common electrode layer in a display panel in some embodiments.
Figure 6B:
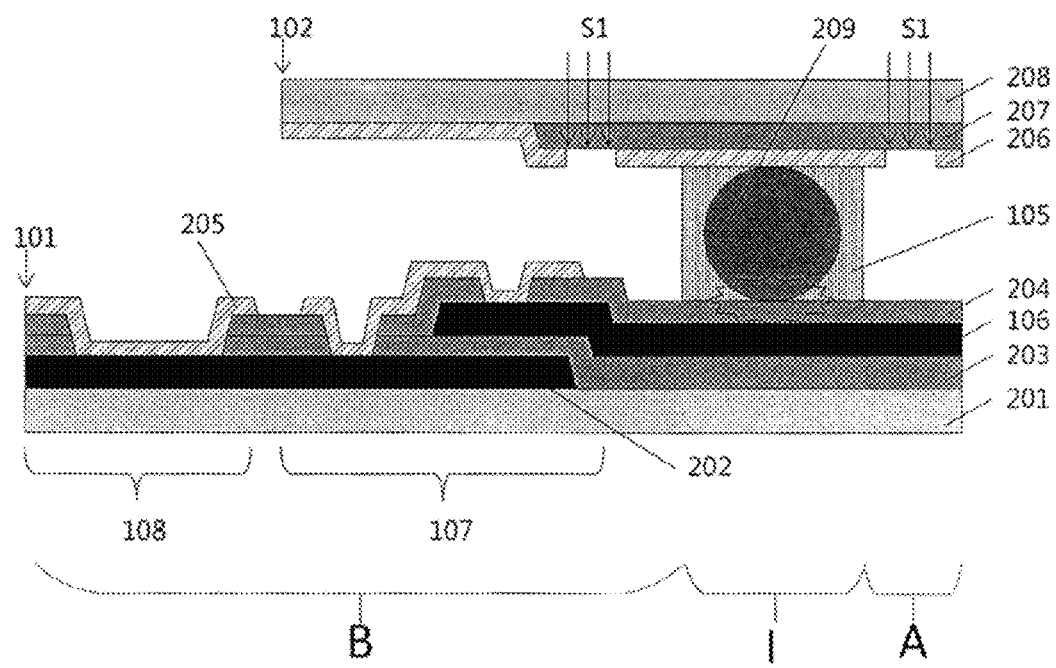

In another aspect, the present disclosure provides a method of repairing an electrical short circuit between the data line and the common electrode layer that substantially obviates the problems due to limitations and disadvantages of the conventional display panel. FIGS. 6A-6B illustrate a process of repairing an electrical short circuit between a data line and a common electrode layer in a display panel. In some embodiments. Referring to FIG. 6A, the portion of the common electrode layer 206 in contact with the conductive component 209 is a connection C as shown in FIG. 3A. As discussed above in connection with FIG. 3A, the connection. C includes a first portion C1 in the first area. A and a second portion. C2 in the second area B. The conductive component 209 in FIG. 6A is in contact with the passivation layer 204. As shown in FIG. 6A, the contacting portion of the passivation layer 204 is damaged, resulting in an electrical short circuit between the data line 106 and the common electrode layer 206.

Referring to FIG. 6B, the portion of the common electrode layer 206 (corresponding to the connection C in FIG. 3A) in contact with the conductive component 209 is cut at both sides (e.g., a first side in the first area A and a second side in the second area B). After the portion of the common electrode layer 206 is cut, it is insulated from the rest of the common electrode layer 206. The cut portion corresponds to the insulated island in FIG. 3B after the connection C FIG. 3A being cut at both the first portion C1 in the first area A and the second portion C2 in the second area B. Once the portion is insulated from the rest of the common electrode layer 206, the electrical short circuit is removed.

In some embodiments, the step of insulating the connection from the common electrode layer is performed by laser cutting the connection at both the first side and the second side. Various alternative embodiments may be practiced to perform the step of insulating.

Accordingly, the present disclosure in another aspect provides a display panel repaired by a repairing method described herein throughout. In some embodiments, the display panel includes an array substrate and an opposing substrate facing the array substrate; a data line layer having a plurality of data lines on the array substrate; a passivation layer on a side of the data line layer proximal to the opposing substrate; a sealant layer on a side of the passivation layer distal to the data line layer, sealing the array substrate and the opposing substrate together; the display panel having a first area enclosed by the sealant layer and a second area outside of the first area and the sealant layer; the plurality of data lines extending from the first area into the second area; and a common electrode layer an a side of the sealant layer distal to the passivation layer. The common electrode layer in the repaired display panel includes a portion having a plurality of connections, at least one insulated island, and a plurality of slits spaced apart from each other by the plurality of connections and the at least one insulated island. Optionally, the plurality of slits, the plurality of connections, and the at least one insulated island extend from the first area into the second area. Each of the plurality of connections is between two adjacent slits. Each of the at least one insulated island is between two adjacent slits. Each of the plurality of connections has a first portion in the first area and a second portion in the second area. Each of the at least one insulated island has a first portion in the first area and a second portion in the second area. Each of the at least one insulated island is insulated from the rest of the common electrode layer by two adjacent slits, a first gap in the first area, and a second gap in the second area. The two adjacent slits, the first gap and the second gap surround a complete periphery of the insulated island.

In another aspect, the present disclosure provides a method of fabricating a display panel, in some embodiments, the method includes forming an opposing substrate on a first base substrate; forming an array substrate on a second base substrate; and sealing the opposing substrate and the array substrate by a sealant layer thereby forming the display panel having a first area enclosed by the sealant layer and a second area outside of the first area and the sealant layer.

In some embodiments, the step of forming the opposing substrate includes forming a common electrode layer on the first base substrate. Optionally, the step of forming the opposing substrate further includes forming a black matrix layer on the first base substrate. The common electrode layer is then formed on a side of the black matrix layer distal to the first base substrate.

In some embodiments, the step of forming the common electrode layer includes forming a slit area in the common electrode layer. The slit area so formed includes a plurality of connections, and a plurality of slits spaced apart by the plurality of connections. The plurality of slits and the plurality of connections extend from the first area into the second area. Each of the plurality of connections is disposed between two adjacent slits. Each of the plurality of connections is formed to have a first side in the first area and a second side in the second area.

In some embodiments, the step of sealing the opposing substrate and the array substrate by the sealant layer includes forming a sealant layer comprising a plurality of conductive components. Optionally, the method further includes electrically connecting the common electrode layer and the common electrode signal line layer by the plurality of conductive components in the sealant layer.

The conductive components may be made of various appropriate materials. Examples of conductive components include, but are not limited to, metal balls such as gold balls or nickel balls. In some examples, the conductive components are made of elastic resin particles coated with metals such as gold or nickel. Optionally, the conductive components have a size in the range of approximately 1 µm to approximately 500 µm.

In some embodiments, the step of forming the array substrate includes forming a data line layer having a plurality of data lines on the second base substrate; and forming a passivation layer on a side of the date line layer distal to the second base substrate. Optionally, the step of forming the array substrate further includes forming a common electrode signal line layer on the second base substrate. Optionally, the step of forming the array substrate further includes forming an insulating layer on a side of the common electrode signal line layer proximal to the sealant layer; forming a conductive layer on a side of the insulating layer distal to the common electrode signal line layer forming a via extending through the insulating layer; electrically connecting the conductive layer and the common electrode signal line layer through the via; and electrically connecting the common electrode layer and the conductive layer by the plurality of conductive components.

Optionally, the data line layer is formed so that the plurality of data lines extending front the first area into the second area through an area substantially corresponding to the slit area in plan view of the display panel.

Optionally, the data line layer and the common electrode layer are so formed that each of the plurality of connections corresponds to one or more data line. Optionally, a projection of each of the plurality of connections overlaps a projection of one or more data line in plan view of the display panel. Optionally, the data line layer and the common electrode layer are so formed that each of the plurality of connections corresponds to a single data line. Optionally, a projection of each of the plurality of connections overlaps a projection of a single data line plan view of the display panel. Optionally, a projection of substantially all data lines on the array substrate overlaps with that of substantially all connection in plan view of the display panel.

In some embodiments, the display panel is of an advanced super dimensional switching (ADS) type, an in-plane switching (IPS) type, a twist nematic (TN) type, or a vertical align (VA) type. Optionally, the display panel is a TN-type display panel.

In another aspect, the present disclosure provides a novel opposing substrate. In some embodiments, the opposing substrate includes a base substrate and a common electrode layer on the base substrate having a portion in a peripheral area of the opposing substrate, the portion including a plurality of connections, and a plurality of slits spaced apart from each other by the plurality of connections. Each of the plurality of connections is arranged between two adjacent slits. Optionally, the opposing substrate further includes a black matrix layer between the base substrate and the common electrode layer, e.g., on a side of the common electrode layer proximal to the base substrate.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to alight emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

In another aspect, the present disclosure provides a display apparatus having a display substrate described herein or fabricated by a method described herein. Examples of appropriate display apparatuses include, but are not limited to, a liquid crystal display panel, an electronic paper, an organic light emitting display panel, a mobile phone, a tablet computer, a television, a monitor, a notebook computer, a digital album, a OPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention." or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined bye the following claims. Moreover, no element and component in the present disclosure is intended to be dedicated to the public regardless of whether the element or component is explicitly recited in the following claims.

What is claimed is:

1. A display panel, comprising:
    an array substrate and an opposing substrate facing the array substrate;
    a data line layer comprising a plurality of data lines on the array substrate;
    a passivation layer on a side of the data line layer closer to the opposing substrate;
    a sealant layer on a side of the passivation layer away from the data line layer, sealing the array substrate and the opposing substrate together; the display panel comprising a first area enclosed by the sealant layer and a second area outside of the first area and the sealant layer; the plurality of data lines extending from the first area into the second area; and
    a common electrode layer on a side of the sealant layer away from the passivation layer, the common electrode layer being in the opposing substrate;
    wherein the common electrode layer comprises a portion having a plurality of connections, and a plurality of slits spaced apart from each other by the plurality of connections; the plurality of slits and the plurality of connections extending from the first area into the second area, a respective one of the plurality of connections is between two adjacent slits; the respective one of the plurality of connections has a first portion in the first area and a second portion in the second area;
    the plurality of connections are directly electrically interconnected in the first area; and
    the plurality of connection are directly electrically interconnected in the second area.

2. The display panel of claim 1, wherein the respective one of the plurality of connections is configured to be insulated from the common electrode layer when cut at both the first portion and the second portion.

3. The display panel of claim 1, further comprising a common electrode signal line layer on the array substrate;
    wherein the sealant layer comprises a plurality of conductive components; and
    the common electrode layer on the opposing substrate and the common electrode signal line layer on the array substrate are electrically connected by the plurality of conductive components.

4. The display panel of claim 3, further comprising an insulating layer on a side of the common electrode signal line layer closer to the sealant layer; and a conductive layer on a side of the insulating layer away from the common electrode signal line layer; the conductive layer being electrically connected to the common electrode signal line layer through a via extending through the insulating layer;
    wherein the common electrode layer on the opposing substrate and the conductive layer on the array substrate are electrically connected by the plurality of conductive components.

5. The display panel of claim 3, wherein the plurality of conductive components are a plurality of gold balls.

6. The display panel of claim 1, wherein the plurality of data lines extending from the first area into the second area through an area substantially corresponding to the portion of the common electrode layer having the plurality of slits and the plurality of connections in plan view of the display panel.

7. The display panel of claim 6, wherein the respective one of the plurality of connections corresponds to a respective one of the plurality of data lines; a projection of the respective one of the plurality of connections on the array substrate overlaps that of the respective one of the plurality of data lines in plan view of the display panel.

8. The display panel of claim 1, wherein the common electrode layer further includes at least one insulated island in the portion having the plurality of connections and the plurality of slits; the plurality of slits being spaced apart from each other by the plurality of connections and the at least one insulated island; a respective one of the at least one insulated island being between two slits adjacent thereto, extending from the first area into the second area; and
    the respective one of the at least one insulated island is insulated from the rest of the common electrode layer by the two slits adjacent thereto, a first gap in the first area, and a second gap in the second area; the two slits adjacent thereto, the first gap and the second gap surrounding a complete periphery of the respective one of the at least one insulated island.

9. The display panel of claim 1, wherein the opposing substrate is a color filter substrate.

10. A display apparatus comprising a display panel of claim 1.

11. A method of repairing an electrical short circuit between a data line and a common electrode layer in a display panel, wherein the display panel comprises:
    an array substrate and an opposing substrate facing the array substrate;
    a data line layer comprising a plurality of data lines on the array substrate;
    a passivation layer on a side of the data line layer closer to the opposing substrate;
    a sealant layer on a side of the passivation layer away from the data line layer, sealing the array substrate and the opposing substrate together; the display panel comprising a first area enclosed by the sealant layer and a second area outside of the first area and the sealant layer; the plurality of data lines extending from the first area into the second area; and a common electrode layer on a side of the sealant layer away from the passivation layer, the common electrode layer being in the opposing substrate;

wherein the common electrode layer comprises a portion having a plurality of connections, and a plurality of slits spaced apart from each other by the plurality of connections; the plurality of slits and the plurality of connections extending from the first area into the second area, a respective one of the plurality of connections is between two adjacent slits; the respective one of the plurality of connections has a first portion in the first area and a second portion in the second area;

the plurality of connections are directly electrically interconnected in the first area; and the plurality of connection are directly electrically interconnected in the second area;

the method comprising:

identifying the data line involved in the electrical short circuit;

identifying a connection in the display panel from an area corresponding to the data line in plan view of the display panel; and insulating the connection from the common electrode layer by disconnecting the connection from the common electrode layer at both the first portion and the second portion.

12. The method of claim 11, wherein the step of insulating the connection from the common electrode layer is performed by laser cutting the connection at both the first portion and the second portion.

13. A method of fabricating a display panel, comprising:
forming an opposing substrate on a first base substrate; the step of forming the opposing substrate comprising forming a common electrode layer on the first base substrate;

forming an array substrate on a second base substrate; the step of forming the array substrate comprises forming a data line layer comprising a plurality of data lines on the second base substrate; and forming a passivation layer on a side of the date line layer away from the second base substrate; and sealing the opposing substrate and the array substrate by a sealant layer thereby forming the display panel comprising a first area enclosed by the sealant layer and a second area outside of the first area and the sealant layer;

wherein the step of forming the common electrode layer comprises forming a plurality of connections, and a plurality of slits spaced apart by the plurality of connections in a portion of the common electrode layer; the plurality of slits and the plurality of connections extending from the first area into the second area, a respective one of the plurality of connections is between two adjacent slits; and the respective one of the plurality of connections is formed to have a first portion in the first area and a second portion in the second area;

the plurality of connections are formed to be directly electrically interconnected in the first area; and the plurality of connection are formed to be directly electrically interconnected in the second area.

14. The method of claim 13, wherein the step of forming the array substrate further comprises forming a common electrode signal line layer on the second base substrate; and
the step of sealing the opposing substrate and the array substrate by the sealant layer comprises forming a sealant layer comprising a plurality of conductive components;

the method further comprising electrically connecting the common electrode layer and the common electrode signal line layer by the plurality of conductive components in the sealant layer.

15. The method of claim 14, wherein the step of forming the array substrate further comprises forming an insulating layer on a side of the common electrode signal line layer closer to the sealant layer; forming a conductive layer on a side of the insulating layer away from the common electrode signal line layer; forming a via extending through the insulating layer; electrically connecting the conductive layer and the common electrode signal line layer through the via; and electrically connecting the common electrode layer and the conductive layer by the plurality of conductive components.

16. The method of claim 14, wherein the plurality of conductive components are a plurality of gold balls.

17. The method of claim 14, wherein the data line layer is formed so that the plurality of data lines extending from the first area into the second area through an area substantially corresponding to the portion of the common electrode layer having the plurality of slits and the plurality of connections in plan view of the display panel.

18. The method of claim 13, wherein the data line layer and the common electrode layer are so formed that the respective one of the plurality of connections corresponds to a respective one of the plurality of data lines; a projection of the respective one of the plurality of connections overlaps a projection of the respective one of the plurality of data lines in plan view of the display panel.

* * * * *